United States Patent [19]

Davis

[11] 4,194,240

[45] Mar. 18, 1980

[54] PRECISION ENVELOPE DETECTOR AND LINEAR RECTIFIER CIRCUITRY

[75] Inventor: Thomas J. Davis, Richland, Wash.

[73] Assignee: United States of America, Washington, D.C.

[21] Appl. No.: 902,250

[22] Filed: May 2, 1978

[51] Int. Cl.² .................... H02M 7/06; G01R 19/04
[52] U.S. Cl. .................... 363/126; 307/317 R; 324/120
[58] Field of Search ............ 363/44, 47, 48, 73, 363/74, 84, 125, 126; 324/DIG. 1, 119, 120; 328/26; 307/317 R, 321

[56] References Cited

U.S. PATENT DOCUMENTS

| | | | |
|---|---|---|---|
| 2,990,477 | 6/1961 | MacIntyre | 307/88.5 |
| 3,112,449 | 11/1963 | Miller | 328/26 |
| 3,302,039 | 1/1967 | Baker | 307/88.5 |
| 3,310,726 | 3/1967 | James | 307/321 X |
| 3,343,064 | 9/1967 | Bright | 363/44 |
| 3,350,623 | 10/1967 | Clapp | 307/317 X |
| 3,389,272 | 6/1968 | Cherry | 307/257 |
| 3,411,066 | 11/1968 | Bravenec | 363/126 |
| 3,617,887 | 11/1971 | Alcaide | 324/120 |
| 3,973,142 | 8/1976 | Hill | 307/255 |
| 3,973,143 | 8/1976 | Embree et al. | 307/255 |

Primary Examiner—J. D. Miller
Assistant Examiner—Peter S. Wong
Attorney, Agent, or Firm—Holman & stern

[57] ABSTRACT

Disclosed is a method and apparatus for the precise linear rectification and envelope detection of oscillatory signals. The signal is applied to a voltage-to-current converter which supplies current to a constant current sink. The connection between the converter and the sink is also applied through a diode and an output load resistor to a ground connection. The connection is also connected to ground through a second diode of opposite polarity from the diode in series with the load resistor. Very small amplitude voltage signals applied to the converter will cause a small change in the output current of the converter, and the difference between the output current and the constant current sink will be applied either directly to ground through the single diode, or across the output load resistor, dependent upon the polarity. Disclosed also is a full-wave rectifier utilizing constant current sinks and voltage-to-current converters. Additionally, disclosed is a combination of the voltage-to-current converters with differential integrated circuit preamplifiers to boost the initial signal amplitude, and with low pass filtering applied so as to obtain a video or signal envelope output.

6 Claims, 7 Drawing Figures

PRECISION ENVELOPE DETECTOR AND LINEAR RECTIFIER CIRCUITRY

The invention described herein was made in the course of work under a grant of award from the Department of Health, Education and Welfare.

BACKGROUND OF THE INVENTION

The present invention relates to linear rectifiers in general, and specifically, to improved dynamic range through the rectification of very small oscillatory input signals.

The prior art teaches the coupling of an oscillatory signal to a solid state diode half-wave rectification, or to a diode bridge or transformer/diode combination for a full-wave rectification. In diodes which are commonly utilized, there is a temperature-dependent voltage which is necessary as a forward bias before the diode will begin conduction. As can be seen by reference to FIG. 1, this small voltage, called the Cutin voltage, is on the order of approximately 0.6 volts, although it can, and does, change with the temperature of the diode. As can be seen with a bias of between 0.4 and 0.6 volts, the diode begins conduction in a non-linear manner.

It is known that a sharp knee can be provided by employing operational amplifier and diode combinations, such as described in *Handbook of Operational Amplifier Applications* by Burr-Brown Research Corporation. Unfortunately, these configurations are not acceptable, in that they do not have a suitable bandwidth for signals in excess of 5 MHz, for example, as required in ultrasonic testing.

Additionally, in the ultrasonic testing field, it is desirable to track the envelope amplitude of the ultrasonic signal on virtually a cycle-by-cycle basis for both large and small signals. Because of the non-linear conduction threshold of the prior art devices, this has heretofore been very inaccurate, and many times impossible.

SUMMARY OF THE INVENTION

It is, therefore, an object of the present invention to provide a method and apparatus for the linear rectification of oscillatory signals, which includes precision tracking of peak signal amplitude on a cycle-by-cycle basis.

It is a further object of the present invention to provide a half-wave rectifier having a bandwidth sufficient for use in ultrasonic testing, and for the rectification of signals having a frequency above 5 MHz.

It is a still further object of the present invention to provide a method for half and full-wave linear rectification of oscillatory signals in which the output is linearly related to the input signal, and does not contain a non-linear portion as a result of the Cutin voltage inherent in diode operation.

An additional object of the present invention is to provide a full-wave linear rectifier which can be utilized for accurate envelope detection, with wide bandwidths at frequencies of 30 MHz and higher.

The above and other objects are achieved by converting the input oscillatory signals' voltage to an oscillating current, which is supplied to a preset constant current sink. The junction between the converter and the current sink is connected either to a diode pair or a diode bridge, for the purpose of providing half or full-wave rectification. Effectively, the present invention is driving a diode bridge with current, rather than voltage, and as a result, the non-linear diode turn-on characteristics are replaced with a sharp knee at the conduction threshold. Preferred embodiments include half and full-wave rectification.

The signal to be rectified can also be applied to a differential circuit having a double-ended output, with the normal and inverted signal from the output being applied to voltage controlled current sources (the voltage-to-current converters). These, then, are connected to constant current sinks, in parallel with the diode bridge. The result is an output which is linear with respect to the input voltage.

BRIEF DESCRIPTION OF THE DRAWINGS

A more complete appreciation of the invention, and many of the attendant advantages thereof, will be readily apparent as the same becomes better understood by reference to the accompanying drawings, wherein.

DETAILED DESCRIPTION OF A PREFERRED EMBODIMENT

Figure 1:
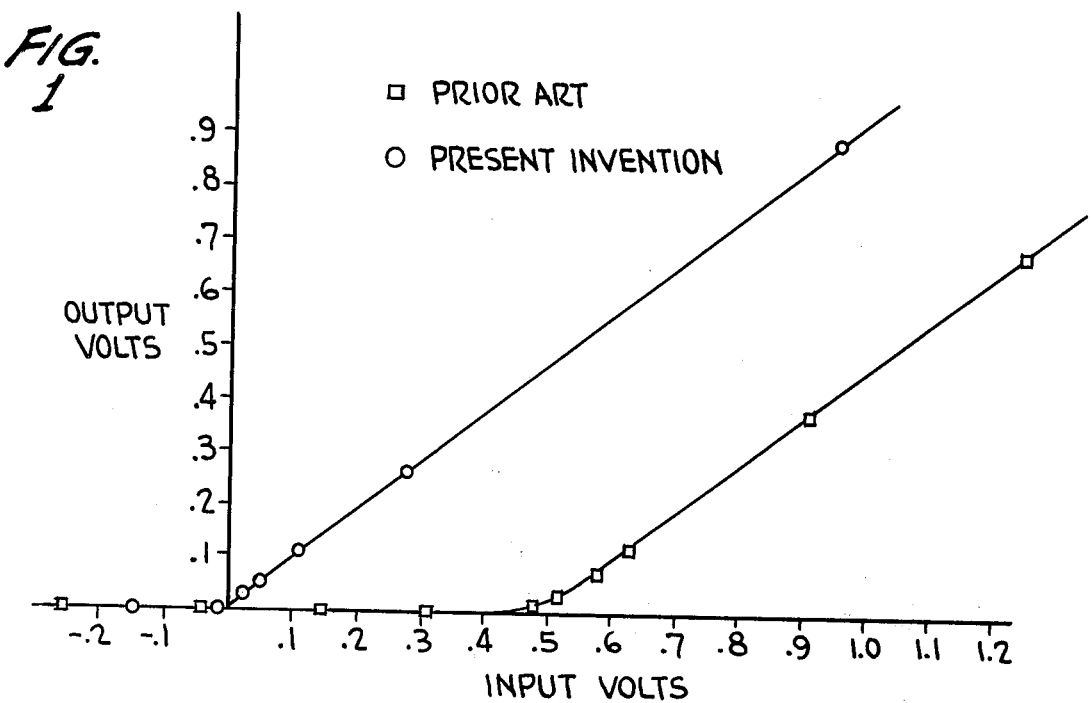
FIG. 1 is a comparison of a prior diode rectifier and the present invention.

Referring now more particularly to the drawings, wherein like numerals represent like elements throughout the several views, FIG. 1 differentiates between the output voltage of the present invention versus the output voltage of the prior art. Regarding the prior art curve, shown by the small squares, the output voltage is determined by the voltage across a resistor, which is in series with the diode. The input voltage is placed across the entire diode/resistor combination, and as can be seen, no output voltage is developed until an input voltage on the order of between 0.4 and 0.6 volts is applied. At this point, the diode is sufficiently forward biased into conduction to cause current to flow through the load resistor, producing an output voltage. As can be seen, above 0.6 input volts, the output voltage is linear with respect to the input voltage.

However, with an input voltage less than 0.6 volts (the so-called Cutin voltage), the output voltage is not linearly related to the input voltage. And for input voltages less than 0.4 volts, there is no output voltage at all. Therefore, small signals (less than 0.4 volts) will not be reflected in the output voltage. Slightly larger signals (in the 0.4 to 0.6 volt range) will be non-linearly reflected in the output voltage. Only signals which are greater than 0.6 volts will be linearly related to the input voltage in the output of a prior art rectifying network.

Figure 2:
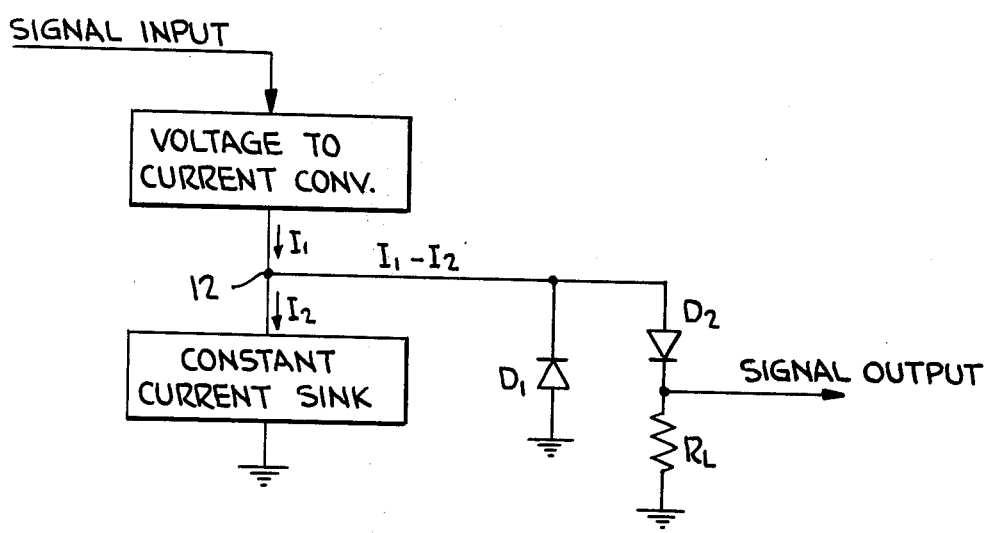
FIG. 2 is an electrical block diagram of a half-wave linear rectifier according to the present invention.

The present invention utilizes the flow of current to drive a diode rectifier, which has the effect of eliminating the Cutin voltage problem associated with prior art rectifying networks. As can be seen in FIG. 2, the signal to be rectified is applied as a signal input to the voltage-to-current converter 10. The converter provides a current output $I_1$ which varies in accordance with the variations of the voltage of the signal input. The output of the voltage-to-current converter is applied to a junction 12, which is also connected to a sink means, for example, constant current sink 14. Junction 12 is connected through a first diode $D_1$ to ground, and also, connected to ground through second diode $D_2$ and load resistor $R_L$. The current going into constant current sink 14 has been labeled $I_2$ and has a certain preset value, which, in a preferred embodiment, would equal $I_1$ which is the current output of the voltage-to-current converter 10, without an input signal applied thereto.

However, when a signal is applied to the converter 10, $I_1$ can be greater than or less than $I_2$, depending on the polarity of the input signal. If $I_1$ is less than $I_2$, and $I_2$ is the current into the sink 14, and is fixed, then the difference current equal to $I_1-I_2$ must flow from the diode network. The current flow would be blocked by the second diode $D_2$, and thus, would flow from ground through the first diode $D_1$, resulting in a zero signal output. On the other hand, if $I_1$ were greater than $I_2$, the constant current sink would require a difference current $(I_2-I_1)$ to flow from junction 12 towards the diode network. Clearly, the first diode $D_1$ would prevent the flow to ground from junction 12. However, the second diode $D_2$ would permit current to flow from junction 12 through the load resistor and the second diode to ground. As the current flowed through the load resistor, it would produce a voltage drop across the load resistor $R_L$, proportional to the amount of current flowing therethrough. Thus, the operation of the network in FIG. 2 would be analogous to that of a conventional half-wave rectifier, with one major difference. Because the input voltage signal is converted to a current flow, providing current to a constant current sink 14, a variable difference current will be applied to the diode network, rather than a variable voltage which is the characterization of the prior art rectifiers. Because $I_2$ would be adjusted to precisely equal $I_1$ (in the absence of an input signal), the difference current $(I_1-I_2)$ would precisely reflect the signal input, and thus, would create a half-wave rectified signal output across load resistor $R_L$. Clearly, the constant current sink 14 could be adjusted above or below the steady state (absence of an input signal) output $I_1$ of the voltage-to-current converter 10, which would provide either a clipped or biased signal output across load resistor $R_L$.

In order to achieve full-wave rectification of the signal input, it would be necessary to provide signals which are 180° out of phase with each other, as is normally provided by a center tap transformer in the conventional rectifier circuit.

Figure 3:
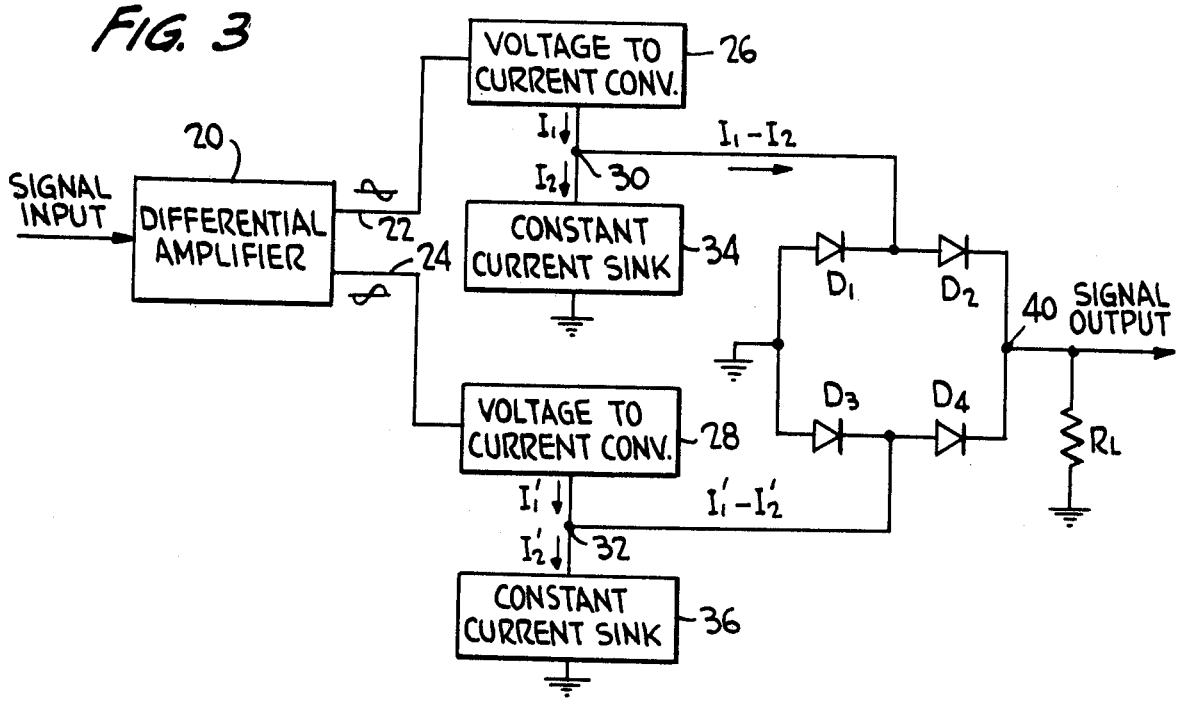
FIG. 3 is an electrical block diagram of a full-wave linear rectifier according to one embodiment of the present invention.

In the present invention, a diode network will be operated in "push-pull" fashion, and also requires two signals which are 180° out of phase with each other. Thus, as can be seen in FIG. 3, the signal input can be applied to a differential amplifier 20, which provides two voltage varying outputs 22 and 24, which are 180° out of phase. Each output of the differential amplifier is applied to separate voltage-to-current converters 26 and 28 which convert the voltage varying signal into a current varying output $I_1$ and $I_1'$, respectively. The outputs of the voltage-to-current converters 26 and 28 are applied to junctions 30 and 32, respectively. Connected to these junctions are the inputs to constant current sinks 34 and 36, which are adjusted to absorb currents $I_2$ and $I_2'$ from junctions 30 and 32, respectively. Thus, it will be seen that difference currents $I_1-I_2$ and $I_1'-I_2'$ will be applied to the diode network comprised of two pairs of diodes ($D_1/D_2$ and $D_3/D_4$), each pair connected in parallel with the other pair of diodes. The diodes in the individual pairs are connected in series with each other ($D_1$ in series with $D_2$ and $D_3$ in series with $D_4$), with the ends of each pair connected together at terminals 38 and 40. It can be seen that the connection between the diodes that are in series (i.e., the connection between $D_1$ and $D_2$ and the connection between $D_3$ and $D_4$) are connected to junctions 30 and 32, respectively. One terminal, for example, terminal 38, is grounded, with the other terminal, in this case, terminal 40, connected to ground through load resistor $R_L$.

The operation of the full-wave rectifier is precisely the same as the operation of the half-wave rectifier disclosed in FIG. 2, with diodes $D_1$ and $D_2$ operating in the same manner. As was seen in FIG. 2, a current flow through the load resistor was induced only during one half of the input signal, although whether it was the positive going half or negative going half of the signal is dependent on the polarity of diodes $D_1$ and $D_2$. In the full-wave rectifier, it can be seen that a current flow through the load resistor $R_L$ will be induced at all times, with the first half due to the negative going output 24 of the differential amplifier 20, and the second half due to the negative going portion of signal 22. Of course, when the diodes actually conduct depends upon their polarity, which in turn will determine the polarity of the output across load resistor $R_L$. The important point to note is that in the preferred embodiment, $I_1$ would be adjusted to equal $I_2$ and $I_1'$ would be adjusted to equal $I_2'$, both in the absence of an input signal to the differential amplifier 20. This does not require that $I_1$ equal $I_1'$, but rather, only requires that constant current sinks 34 and 36 be adjusted to balance the no-signal current from voltage-to-current converters 26 and 28, respectively. This, then, ensures that the difference currents ($I_1-I_2$ and $I_1'-I_2'$) will be equal, presuming that the output amplitude of signals 22 and 24 are the same, although 180° out of phase.

Thus, it can be seen that a full-wave rectified output across the load resistor will appear, with the output linearly related to the signal input regardless of the input signal amplitude. Therefore, in both the half-wave (FIG. 2) and full-wave (FIG. 3) rectifiers, an input voltage having a maximum amplitude of 0.6 volts will produce an output which is linearly related thereto during the signal voltage range of from 0 to 0.6 volts.

Figure 4:
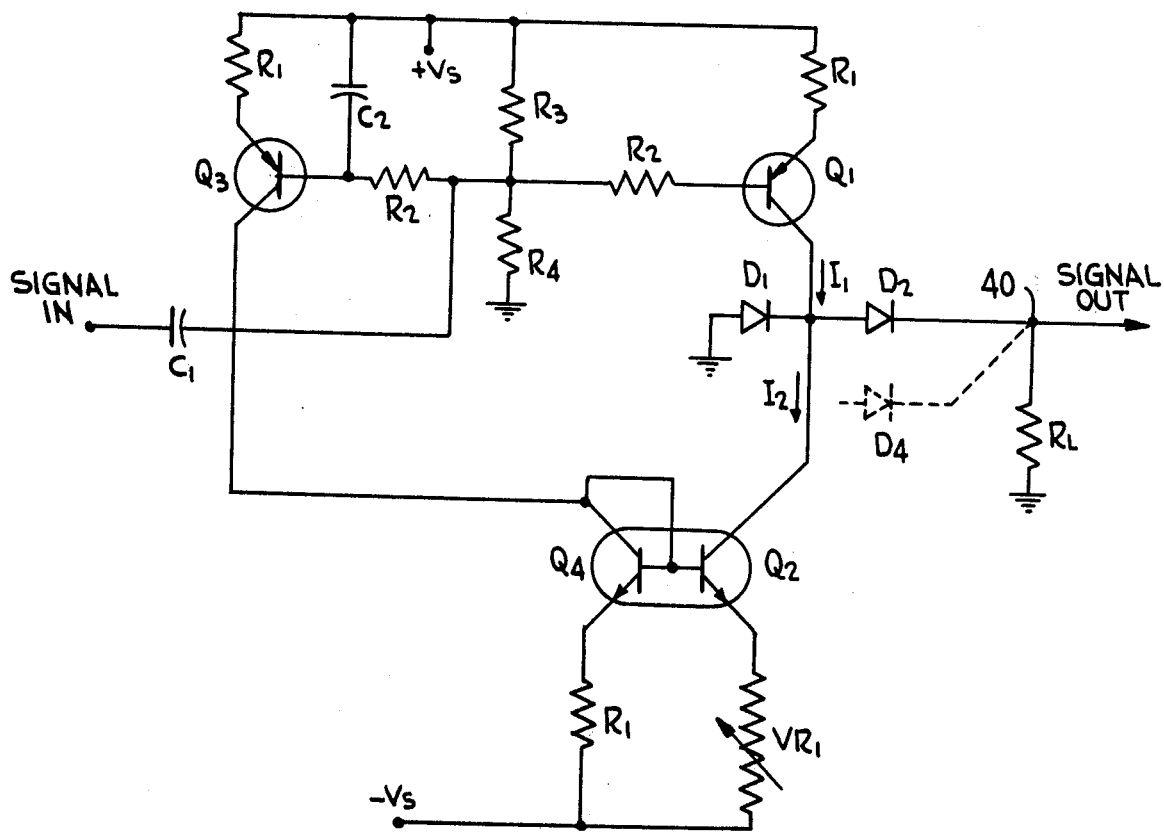
FIG. 4 is an electrical schematic of one preferred embodiment of the present invention.

This is particularly advantageous in tracking the envelope amplitude on a cycle-by-cycle basis, as in ultrasonic testing. It should additionally be noted that a pre-amplifier circuit can be utilized to boost signal amplitude prior to the rectification process, and the differential amplifier 20 could be so equipped. One preferred embodiment of the half-wave rectifier of FIG. 2 is shown in FIG. 4, and operates as follows.

Transistors $Q_1$ and $Q_2$ generate output currents $I_1$ and $I_2$, respectively. The signal input is applied through capacitor $C_1$ and resistor $R_2$ to the base of transistor $Q_1$ and transistor $Q_3$. The conduction level of $Q_2$ is set by adjusting variable resistor $VR_1$. This conduction level is established, such that $I_1$ is equal to $I_2$ in an absence of a signal applied to the base of transistor $Q_1$. Thus, it can be seen that if $I_1$ is less than $I_2$, the excess current into $Q_2$ must be provided from ground through diode $D_1$. However, if $I_1$ is greater than $I_2$, the excess current flows through diode $D_2$, and through load resistor $R_L$ to ground. It should be pointed out that the indicated similarity of resistance in the resistances $R_1$ of the emitter collector circuits for transistors $Q_1$, $Q_3$ and $Q_4$ indicates that in a preferred embodiment, these will have the same value. Variable resistor $VR_1$ in the collector emitter circuit of $Q_2$ is nominally the same value as resistance $R_1$, but can be varied in order to preset $I_2$ flowing through transistor $Q_2$. In this particular embodiment, positive and negative power supplies $+V_S$ and $-V_S$, respectively, are utilized, although other power supplies will be readily apparent. The circuitry associated with transistors $Q_3$ and $Q_4$ serves to bias the rectifying circuit so as to eliminate dependence upon matching the + and − supplies in this embodiment.

Resistors $R_3$ and $R_4$ provide a voltage bias for transistors $Q_1$ and $Q_3$ by means of resistor $R_2$. In a preferred embodiment, capacitor $C_2$ would be selected to have a reactance much smaller than $R_2$, such that no AC signals-in are applied to the base of $Q_3$. Resistors $R_2$ would be chosen much smaller than the base input resistance of transistors $Q_1$ and $Q_3$, such that the bias voltage, or in the case of $Q_1$, the signal voltage, is not attenuated. Thus, the steady state (no signal applied) collector currents of both $Q_1$ and $Q_3$ will be reasonably well matched, and will remain matched for variations in either power supply level.

The collector current of $Q_3$ is forced through the base emitter junction of $Q_4$ through resistor $R_1$, and thence, to the negative power supply $-V_S$. The resultant voltage dropped across the collector of $Q_4$ and the negative power supply serves to bias the base of transistor $Q_2$. The emitter resistance of $Q_2$ is made equal to $R_1$, such that its collector current will be equal to that of $Q_3$, and will track the $Q_3$ collector current very closely. This tracking is ensured if the base emitter junctions of $Q_2$ and $Q_4$ are made from a matched differential pair, and are maintained at the same temperature. The result will be that the steady state $I_1$ and $I_2$ current levels can be very closely matched (with final adjustment being accomplished by resistor $VR_1$), and will remain matched over wide variations in supply level voltage, or ambient temperatures.

Thus, it can be seen that the circuitry of FIG. 4 can be applied to provide the voltage-to-current conversion, and the constant current sink of the linear half-wave rectifier shown in FIG. 2. By supplying a duplicate of the circuit of FIG. 4, and connecting that to diodes 3 and 4 (instead of diodes 1 and 2), the other half of the full-wave rectifier can be provided, as shown in the block diagram of FIG. 3. The connection of terminal 40 and diode $D_4$ with diodes $D_1$ and $D_2$ is shown in dotted lines in FIG. 4.

Figure 5:
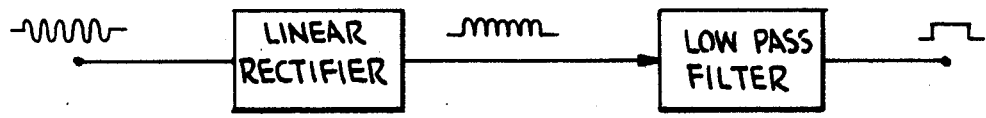
FIG. 5 is an electrical block diagram of a linear rectifier in combination with the low pass filter, showing the appropriate wave form.
Figure 6:
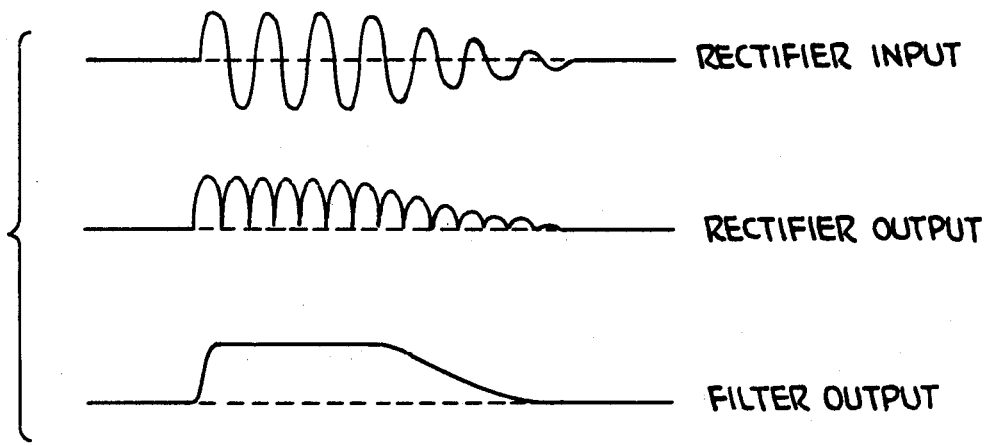
FIG. 6 is a comparison of voltage versus time for the rectifier input, rectifier output and filter output, respectively.

One preferred embodiment for converting the rectified signal from the linear rectifier into envelope or video information employs an active low pass filter, as shown in FIG. 5. A second order filter (40 dB per decade) may be used, wherein the corner frequency is placed approximately equal to the signal frequency. The filter is provided with a voltage gain of 1/0.636 so that its output will equal the peak amplitude of the oscillatory input signal. Otherwise, its output would equal the average value of a half cycle of the input sign wave, which is 0.636 times the peak amplitude. Wave forms involved in envelope detection of an oscillatory burst are shown in FIG. 6.

Figure 7:
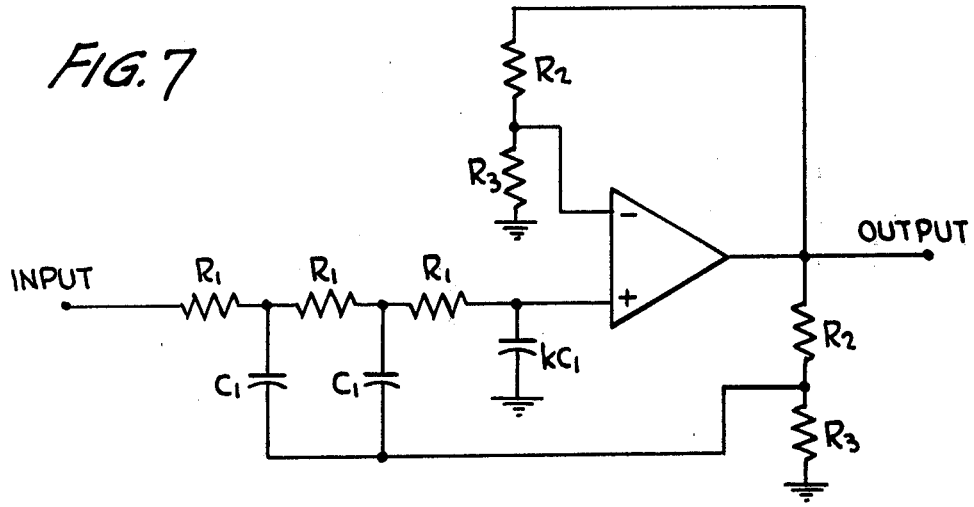
FIG. 7 is an electrical schematic of one embodiment of the low pass filter.

The filter itself can be based on a wide variety of designs and can be either active or passive. A preferred embodiment is shown in FIG. 7 whose basic design is described in "Active Bandpass Filters," *EEE Magazine*, August 1966, pp. 115–119. The input R-C network establishes the corner frequency of $f = \frac{1}{2}\pi R_1 C_1$. The addition of a pair of voltage dividers with resistors $R_2$ and $R_3$ provide the filter with the required gain of 1/0.636. They are selected so that $(R_3/R_2+R_3)=0.636$ and that the parallel combination $(R_2R_3/R_2+R_3)>>R_1$. The design shown can accomodate oscillatory burst signals of up to 30 MHz if some time lag can be tolerated between arrival of the burst and steady state filter output. However, a passive filter yields best results at these high frequencies.

Thus, in view of the above teachings, modification of the circuitry of FIGS. 4 and 7, and the applications of the circuitry in FIGS. 1–3 and 5 will become obvious to those of ordinary skill in the art. Different power supplies and/or arrangements of the components can be provided to meet the requirements of individual applications, and the invention is not limited to the embodiments and applications expressed herein. The linear half and full-wave rectifiers, described hereinbefore, are only limited in accordance with the appended claims.

The embodiments of the invention in which an exclusive property or privilege is claimed are defined as follows:

1. A linear rectifier for the rectification of an input low voltage, high frequency signal comprising:
   voltage-to-current converter means, having an input, said input connected to said signal, for transforming said input low voltage signal into variations in output current flow, said variations linearly related to said low voltage, high frequency signal, said converter means providing a constant output in the absence of an input signal;
   sink means connected to the output of said converter means, for absorbing a preset constant amount of current from said converter means;
   first diode means, having two ends and a polarity, one end of which is connected to a junction between said converter means and said sink means, and the other end of which is grounded; and
   second diode means having a polarity, said second diode means connected in series with a resistance means for providing a voltage drop across said resistance means when current flows therethrough, said second diode means and said resistance means together having two ends, one of which is connected to said junction and the other of which is grounded, said second diode connected to have a polarity opposite the polarity of said first diode.

2. The linear rectifier of claim 1 for the rectification of an input low voltage, high frequency signal further including a low pass filter network means for providing an output equal to the envelope of the input signal.

3. The linear rectifier of claim 2, wherein said low pass filter means includes means for providing a voltage gain of 1/0.318, such that the output envelope amplitude is equal to the peak amplitude of the input signal.

4. A linear rectifier for the rectification of an input low voltage, high frequency signal comprising:
   differential amplifier means connected to said input signal, for providing two output signals 180° out of phase with each other;
   first voltage-to-current converter means having an input and an output, said input connected to one of said differential amplifier means output signals, for transforming said one of said output signals into variations in an output current flow, said variations linearly related to said input signals, said converter means providing a constant output in the absence of an input signal;

second voltage-to-current converter means having an input and an output, said input connected to the other of said differential amplifier means output signals, for transforming said other output signal into variations in output current flow, said variations linearly related to said input signals and 180° out of phase with the output of said first voltage-to-current converter means, said second converter means providing a constant output in the absence of an input signal;

first sink means, connected to the output of said first voltage-to-current converter means, for absorbing a preset constant amount of current from said converter means;

second sink means, connected to the output of said second voltage-to-current converter means, for absorbing a preset constant amount of current from said converter means;

diode bridge means comprising two pairs of diodes connected in parallel, each pair of diodes including two diodes connected in series, said bridge means including two end terminals connecting said pairs of diodes in parallel and two junction terminals, each junction terminal connected to a junction joining said diodes connected in series, all of said diodes having a polarity so as to permit current flow from one of said terminals to the other terminal and inhibit current flow from said other terminal to said one of said terminals; and resistance means for providing a voltage drop across said resistance means when current flows therethrough, said resistance means connecting one of said terminals to ground, the other of said terminals connected directly to ground.

5. The linear rectifier of claim 4 for the rectification of an input low voltage, high frequency signal further including a low pass filter network means for providing an output equal to the envelope of the input signal.

6. The linear rectifier of claim 4, wherein said low pass filter means includes means for providing a voltage gain of 1/0.636, such that the output envelope amplitude is equal to the peak amplitude of the input signal.

* * * * *